US008624397B2

(12) United States Patent
Maki et al.

(10) Patent No.: US 8,624,397 B2
(45) Date of Patent: Jan. 7, 2014

(54) ELECTRODE LAYER STRUCTURE FOR A THIN-FILM TRANSISTOR AND PROCESS FOR MANUFACTURE THEREOF

(75) Inventors: Kazunari Maki, Saitama (JP); Kenichi Yaguchi, Ageo (JP); Yosuke Nakasato, Osaka (JP)

(73) Assignees: Mitsubishi Materials Corporation, Tokyo (JP); Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/265,022

(22) PCT Filed: May 11, 2010

(86) PCT No.: PCT/JP2010/003187
§ 371 (c)(1),
(2), (4) Date: Oct. 18, 2011

(87) PCT Pub. No.: WO2010/143355
PCT Pub. Date: Dec. 16, 2010

(65) Prior Publication Data
US 2012/0068265 A1    Mar. 22, 2012

(30) Foreign Application Priority Data
Jun. 12, 2009    (JP) .................. 2009-141440

(51) Int. Cl.
H01L 29/40    (2006.01)
H01L 21/4763    (2006.01)

(52) U.S. Cl.
USPC .............. 257/762; 257/E29.273; 257/E21.04; 438/648

(58) Field of Classification Search
CPC .................. H01L 23/53238; H01L 21/76843; H01L 21/76877; H01L 2924/01079; H01L 2924/01013
USPC .................... 257/347, 762, E29.273, E21.04; 438/104, 648, 510
See application file for complete search history.

(56) References Cited

U.S. PATENT DOCUMENTS

2007/0145591 A1* 6/2007 Yano et al. ..................... 257/758
2009/0090942 A1* 4/2009 Kim et al. ...................... 257/288
2011/0068402 A1* 3/2011 Takasawa et al. ............. 257/347

FOREIGN PATENT DOCUMENTS

| JP | 03-166731 A | 7/1991 |
| JP | 06-177128 A | 6/1994 |
| JP | 06-333925 A | 12/1994 |
| JP | 11-054458 A | 2/1999 |
| JP | 2007-027259 A | 2/2007 |

(Continued)

OTHER PUBLICATIONS

Nikkei Business Electronics, Nikkei Business Publications, Inc., the issue of Feb. 9, 2009, p. 52-56, Published in Jan. 2009 and English abstract thereof.

Junno Onishi, "[FPDI Preview] New Cu alloy for TFT Wiring of Large-sized FPD, Overcoming Problems by ULVAC, Inc. and Mitsubishi Materials Corp." [online], Oct. 27, 2008, Tech-On, [Search, Feb. 12, 2009], Internet <URL(http://techon.nikkeibp.co.jp/articie/NEWS/20081027/160184/> and Englsih abstract thereof.

(Continued)

Primary Examiner — Nikolay Yushin
(74) Attorney, Agent, or Firm — Edwards Wildman Palmer LLP

(57) ABSTRACT

This wiring layer structure includes: an underlying substrate of a semiconductor substrate or a glass substrate; an oxygen-containing Cu layer or an oxygen-containing Cu alloy layer which is formed on the underlying substrate; an oxide layer containing at least one of Al, Zr, and Ti which is formed on the oxygen-containing Cu layer or the oxygen-containing Cu alloy layer; and a Cu alloy layer containing at least one of Al, Zr, and Ti which is formed on the oxide layer.

20 Claims, 9 Drawing Sheets

(56) References Cited

FOREIGN PATENT DOCUMENTS

| JP | 2009-010089 A | 1/2009 |
| KR | 10-2009-0045255 A | 5/2009 |
| KR | 10-2009-0053853 A | 5/2009 |
| WO | WO-2008/081805 A1 | 7/2008 |
| WO | WO-2008/081806 A1 | 7/2008 |
| WO | WO 2009/128372 | * 10/2009 |

OTHER PUBLICATIONS

International Search Report dated Jun. 15, 2010, issued for PCT/JP2010/003187.

Notice of Allowance dated Feb. 19, 2013, issued for the Korean patent application No. 10-2011-7024816 and English translation thereof.

* cited by examiner

ELECTRODE LAYER STRUCTURE FOR A THIN-FILM TRANSISTOR AND PROCESS FOR MANUFACTURE THEREOF

TECHNICAL FIELD

The present invention relates to a wiring layer structure. In particular, the present invention relates to a wiring layer structure used in a semiconductor device such as a transistor and the like and a method for manufacturing the wiring layer structure.

The present application claims priority on Japanese Patent Application No. 2009-141440 filed on Jun. 12, 2009, the content of which is incorporated herein by reference.

BACKGROUND ART

From the viewpoint of high-speed driving and reduction in cost, expectations have been focused on a Cu-based wiring layer having a lower resistivity than that of an Al-based wiring layer which is the mainstream of a wiring layer for a TFT panel at present.

However, there are problems in that Cu is inferior in an adhesion property to underlying substrate materials such as glass, Si, and the like, compared to adhesion properties of wiring materials such as Al and the like, and Cu is diffused to an underlying substrate.

In order to overcome such problems, a Cu wiring was developed in which an oxide layer of a Cu alloy was formed on a glass substrate or an amorphous Si substrate and a layer of Cu alone or a Cu alloy was formed thereon, by a method of sputtering a Cu alloy in an oxygen atmosphere (see, for example, Non-Patent Document 1). In this wiring layer, the layer of Cu alone or the Cu alloy secures a low electrical resistance, and the oxide layer of the Cu alloy enhances the adhesion of the interface between the Cu wiring and an underlying substrate, and in addition, the oxide layer of the Cu alloy serves as a barrier layer for preventing Cu from being diffused to the underlying substrate.

With regard to the wiring layer in which a Cu alloy is used, wiring layers which contain a variety of additive elements are proposed (see Patent Documents 1 and 2).

These Patent Documents disclose a technique in which a pure copper target (or a target in which at least one selected from Mg, Al, Si, Be, Ca, Sr, Ba, Ra, Sc, Y, La, Ce, Pr, Nd, Pm, Sm, Eu, Gd, Tb, and Dy is added) is sputtered while introducing oxygen gas so as to form a barrier layer which contains copper as a main component and oxygen, and then the introducing of the oxygen gas is stopped, and the above-mentioned target is sputtered so as to form a low-resistivity layer of pure copper. The above-mentioned barrier layer which contains copper as a main component and oxygen has a high adhesion property to silicon and glass and a low electrical resistance, and the barrier layer also prevents copper from being diffused to a silicon substrate.

In the wiring layer formed as mentioned above, a wiring layer pattern is formed as follows. An opening is formed in a resist film along a predetermined pattern, and a material of the wiring layer exposed to the opening is removed by dry or wet etching. As a result, a portion of an underlying layer becomes in an exposed state.

It is known that in the case where the above-mentioned Cu wiring layer pattern is formed on a non-single crystal semiconductor thin film such as an amorphous silicon thin film or a polycrystalline silicon thin film and a portion of the semiconductor thin film is exposed, a large number of dangling bonds (bonding partners which are not involved in a bond due to losing their covalent bonding partners) exist in the surface of the exposed semiconductor thin film The dangling bonds are unstable. Therefore, a hydrogen plasma treatment is generally conducted so as to terminate and stabilize the dangling bonds after the wiring layer pattern (source and drain electrode and the like) is formed in a process of manufacturing a semiconductor element (such as a TFT) which includes the non-single crystal semiconductor thin film.

The following phenomenon is reported which occurs in the hydrogen plasma treatment. Hydrogen ions easily infiltrate and penetrate into the wiring layer. Then, the oxide layer of the Cu alloy is reduced, and the reduced oxygen is bonded to hydrogen to generate water (water vapor). As a result, the layer is peeled off at the interface and the adhesion property is deteriorated (see, for example, Non-Patent Document 2).

Therefore, the development of a Cu wiring layer having a high hydrogen plasma resistance (resistance to hydrogen plasma) is required in which troubles such as the deterioration of the adhesion property do not occur after the above-mentioned hydrogen plasma treatment.

PRIOR ART DOCUMENTS

Patent Documents

Patent Document 1: PCT International Publication No. WO2008/081805
Patent Document 2: PCT International Publication No. WO2008/081806

Non-Patent Documents

Non-Patent Document 1: Nikkei Business Electronics, Nikkei Business Publications, Inc., the issue of Feb. 9, 2009, p 52-56, published in January, 2009
Non-Patent Document 2: Junno Onishi, "[FPDI Preview] New Cu alloy for TFT Wiring of Large-sized FPD, Overcoming Problems by ULVAC, Inc. and Mitsubishi Materials Corp." [online], Oct. 27, 2008, Tech-On, [Search, Feb. 12, 2009], Internet <URL(http://techon.nikkeibp.co.jp/article/NEWS/20081027/160184/>

DISCLOSURE OF THE INVENTION

Problems to be Solved by the Invention

Therefore, the present invention aims to provide a wiring layer structure which has a high adhesion property to an underlying layer of a semiconductor or a glass substrate, an excellent diffusion barrier property to prevent diffusion to the underlying layer, an excellent hydrogen plasma resistance (excellent resistance to hydrogen plasma), and a low electrical resistance, and a method for manufacturing the same.

Means for Solving the Problems

In order to solve the above-mentioned problems, the wiring layer structure according to the present invention includes: an underlying substrate of a semiconductor substrate or a glass substrate; an oxygen-containing Cu layer or an oxygen-containing Cu alloy layer which is formed on the underlying substrate; an oxide layer containing at least one of Al, Zr, and Ti which is formed on the oxygen-containing Cu layer or the oxygen-containing Cu alloy layer; and a Cu alloy layer containing at least one of Al, Zr, and Ti which is formed on the oxide layer. Here, examples of "the semiconductor substrate or the glass substrate" include a substrate which includes a semiconductor layer or a silica layer provided in one surface.

In the present invention, the oxide layer containing at least one of Al, Zr, and Ti is formed between the Cu alloy layer containing at least one of Al, Zr, and Ti and either of the oxygen-containing Cu layer or the oxygen-containing Cu alloy layer, and the oxygen-containing Cu layer or the oxygen-containing Cu alloy layer is provided in order to improve the adhesion property to the underlying substrate such as a semiconductor substrate and a glass substrate. Even when the hydrogen plasma treatment is further performed, hydrogen ions hardly penetrate into the oxygen-containing Cu layer or the oxygen-containing Cu alloy layer (the hydrogen plasma resistance is improved) due to the existence of the oxide layer. Thereby, the reduction of oxygen in the oxygen-containing Cu layer or the oxygen-containing Cu alloy layer hardly occurs; and as a result, the layer is hardly peeled off at the interface, and the adhesion property can be further improved.

The oxygen-containing Cu alloy layer may contain at least one additive element selected from a group consisting of Ca, Mg, Li, Al, Zr, Ti, Si, Mn, Cr, and rare earth metals. In this case, these additive elements cause the oxide layer to be more easily formed in the interface between the Cu alloy layer and either of the oxygen-containing Cu layer or the oxygen-containing Cu alloy layer. In addition, these additive elements also have an effect of enhancing the adhesion property between the oxygen-containing Cu alloy layer and the underlying substrate.

The content of the additive elements contained in the oxygen-containing Cu layer or the oxygen-containing Cu alloy layer may be in a range of 20 atom % or less, and preferably in a range of 15 atom % or less. In the case where the content of the additive elements is 20 atom % or less, the amount of oxides or intermetallic compounds generated in the oxygen-containing Cu layer or the oxygen-containing Cu alloy layer is limited; and thereby, the value of electrical resistance does not remarkably increase, and problems do not occur when utilizing the wiring layer structure as the wiring layer.

The content of oxygen contained in the oxygen-containing Cu layer or the oxygen-containing Cu alloy layer may be in a range of 1 atom % to 30 atom %. In the case where the content of the oxygen is 1 atom % or more, sufficient adhesion property to a material of the underlying substrate and sufficient diffusion barrier property (barrier property to prevent diffusion) can be obtained. In the case where the content of the oxygen is 30 atom % or less, the amount of oxides generated in the oxygen-containing Cu layer or the oxygen-containing Cu alloy layer is limited. Thereby, the value of electrical resistance does not remarkably increase, and problems do not occur when utilizing the wiring layer structure as the wiring layer.

Either of the oxygen-containing Cu layer or the oxygen-containing Cu alloy layer, and the Cu alloy layer located above the oxide layer may further contain at least one additive element selected from a group consisting of Ca, Mg, Li, Si, Mn, Cr, and rare earth metals. The total content of the additive elements of Al, Zr, and Ti contained in the Cu alloy layer may be in a range of 1 atom % to 15 atom % or less, and preferably in a range of 4 atom % to 10 atom %. In the case where the content of the additive elements is 1 atom % or more, the oxide layer is sufficiently formed in the interface between the Cu alloy layer and either of the oxygen-containing Cu layer or the oxygen-containing Cu alloy layer; and as a result, the peeling resistance (resistance to peeling) of the interface, that is, the adhesion property can be sufficiently improved. In the case where the content of the additive elements is 15 atom % or less, the value of electrical resistance of the Cu alloy layer does not remarkably increase, and problems do not occur when utilizing the wiring layer structure as the wiring layer. The content of Ca, Mg, Li, Si, Mn, Cr, and rare earth metals may be in a range of 5 atom % or less. In the case where the content is 5 atom % or less, the resistance value (value of electrical resistance) does not remarkably increase.

In the present invention, a Cu conductive layer formed on the Cu alloy layer may be further included. The Cu conductive layer may contain Cu at a content in a range of 99 atom % or more. Thereby, it is possible to provide a low-resistive wiring layer.

The oxygen-containing Cu layer or the oxygen-containing Cu alloy layer may have a thickness of 10 nm to 100 nm, and may preferably have a thickness of approximately 30 nm to 50 nm. The oxide layer may have a thickness of 1 nm to 20 nm, and may preferably have a thickness of approximately 5 nm, in order to obtain the excellent hydrogen plasma resistance. In the case where the thickness of the oxide layer is 1 nm or more, the oxide layer becomes uniform, and an effect of preventing the hydrogen ions from penetrating is sufficiently obtained; and thereby, the excellent hydrogen plasma resistance can be obtained. In the case where the thickness of the oxide layer is 20 nm or less, the value of electrical resistance does not remarkably increase, and problems do not occur when utilizing the wiring layer structure as the wiring layer. The Cu alloy layer may have a thickness of 10 nm to 100 nm, and may preferably have a thickness of approximately 30 nm to 50 nm. The Cu conductive layer may have a thickness of 200 nm to 10 μm, and may preferably have a thickness of approximately 300 nm to 500 nm.

The method for manufacturing a wiring layer structure according to the present invention includes: in series, a step (a) of performing sputtering in a $O_2$ atmosphere using a target containing at least Cu on an underlying substrate of a semiconductor substrate or a glass substrate; a step (b) of performing sputtering in an inert gas atmosphere using a Cu alloy containing at least one of Al, Zr, and Ti as a target; a step (c) of forming a wiring layer pattern in layers formed by the step (a) and the step (b) through etching, and exposing a portion of the underlying substrate; and a step (d) of performing a hydrogen plasma treatment to terminate dangling bonds which exist in an exposed surface of the underlying substrate, wherein the method further includes a step (e) of performing annealing in a hydrogen atmosphere after the step (b) and before the step (d).

In the present invention, sputtering is performed in the $O_2$ atmosphere using the target containing at least Cu on an underlying substrate (step (a)), and then sputtering is performed in the inert gas atmosphere using the Cu alloy containing at least one of Al, Zr, and Ti as a target (step (b)). Thereafter, the wiring layer pattern is formed in the layers formed by the step (a) and the step (b) through etching; and thereby, a portion of the underlying substrate is exposed (step (c)). In this state, the hydrogen plasma treatment is performed to terminate and stabilize the dangling bonds which exist in the exposed surface of the underlying substrate (step (d)). In addition, after the step (b) and before the step (d), annealing is further performed in a hydrogen atmosphere (step (e)). By performing the annealing in the hydrogen atmosphere, an oxide layer containing at least one of Al, Zr, and Ti is formed between the oxygen-containing Cu layer (or the oxygen-containing Cu alloy layer) formed by the step (a) and the Cu alloy layer formed by the step (b). In detail, oxygen atoms (O) are diffused to the Cu alloy layer formed by the step (b); and thereby, the oxide layer is formed in the interface between the Cu alloy layer and the oxygen-containing Cu layer (or the oxygen-containing Cu alloy layer). In addition, it is possible to obtain a sufficient thickness of the oxide layer containing at least one of Al, Zr, and Ti in accordance with the conditions of the annealing in the hydrogen atmosphere. Even in the case where the hydrogen plasma treatment is further performed, the hydrogen ions hardly penetrate into the oxygen-containing Cu layer (or the oxygen-containing Cu alloy layer) due to the existence of the oxide layer (hydrogen plasma resistance). Thereby, the reduction of oxygen hardly occurs in the oxygen-containing Cu layer (or the oxygen-containing Cu alloy layer); and as a result, the layer is hardly peeled off at the interface, and the adhesion property can be further improved.

The target containing at least Cu used in the step (a) may further contain at least one additive element selected from a group consisting of Ca, Mg, Li, Al, Zr, Ti, Si, Mn, Cr, and rare earth metals. In this case, these additive elements cause the oxide layer to be formed more easily in the interface between the Cu alloy layer and either of the oxygen-containing Cu layer or the oxygen-containing Cu alloy layer. In addition, these additive elements also have an effect of enhancing the adhesion property between the oxygen-containing Cu alloy layer and the underlying substrate.

The content of the additive elements may be in a range of 20 atom % or less, and preferably in a range of 15 atom % or less. In the case where the content of the additive elements is 20 atom % or less, the amount of oxides or intermetallic compounds generated in the oxygen-containing Cu layer or the oxygen-containing Cu alloy layer is limited; and thereby, the value of electrical resistance does not remarkably increase, and problems do not occur when utilizing the wiring layer structure as the wiring layer.

The volume fraction of the $O_2$ atmosphere used in the sputtering step (a) may be in a range of 1% to 30%. Thereby, the content of the oxygen contained in the oxygen-containing Cu layer (or the oxygen-containing Cu alloy layer) generated in the sputtering step (a) can be set to be in a range of approximately 1 atom % to 30 atom %.

The Cu alloy target containing at least one of Al, Zr, and Ti may further contain at least one additive element selected from a group consisting of Ca, Mg, Li, Si, Mn, Cr, and rare earth metals. The total content of the additive elements of Al, Zr, and Ti may be in a range of 1 atom % to 15 atom %, and may be preferably in a range of 4 atom % to 10 atom %. In the case where the content of the additive elements is 1 atom % or more, the oxide layer is sufficiently formed in the interface between the Cu alloy layer and either of the oxygen-containing Cu layer or the oxygen-containing Cu alloy layer. Thereby, the peeling resistance of the interface is improved, and the adhesion property is sufficiently improved. In the case where the content of the additive elements is 15 atom % or less, the value of electrical resistance of the Cu alloy layer does not remarkably increase, and problems do not occur when utilizing the wiring layer structure as the wiring layer. The content of Ca, Mg, Li, Si, Mn, Cr, and rare earth metals may be in a range of 5 atom % or less. In the case where the content is 5 atom % or less, the resistance value does not remarkably increase.

A step (f) of performing sputtering in an inert gas atmosphere using a target containing at least Cu may be further included after the step (b).

The target containing at least Cu used in the step (f) may contain Cu at a content in a range of 99 atom % or more. Thereby, it is possible to provide a low-resistive wiring layer.

According to the present invention, a thin-film transistor is provided which includes: an underlying substrate of a semiconductor substrate or a glass substrate; a gate electrode formed on the underlying substrate; a gate insulating layer that covers the gate electrode; a semiconductor layer formed on the gate insulating layer; a source region and a drain region formed on the semiconductor layer; and a source electrode layer and a drain electrode layer formed in contact with the source region and the drain region, respectively, wherein at least one of the gate electrode, the source electrode layer, and the drain electrode layer is formed from the above-mentioned wiring layer structure.

Further, according to the present invention, a method for manufacturing a thin-film transistor is provided which includes: a step of forming a gate electrode on an underlying substrate of a semiconductor substrate or a glass substrate; a step of forming a gate insulating layer that covers the gate electrode; a step of forming a semiconductor layer on the gate insulating layer; a step of forming a semiconductor layer in which an impurity is added at a high concentration on the semiconductor layer; a step of forming a metal wiring layer on the semiconductor layer in which the impurity is added at a high concentration; and a step of patterning the metal wiring layer, the semiconductor layer in which the impurity is added at a high concentration, and the semiconductor layer, wherein the metal wiring layer is manufactured by the above-mentioned method for manufacturing a wiring layer structure, the step of forming the metal wiring layer corresponds to the steps (a) and (b), and the step of patterning corresponds to the step (c).

Effects of the Invention

As described above, in accordance with the present invention, the oxide layer containing at least one of Al, Zr, and Ti is formed in the interface between the Cu alloy layer and either of the oxygen-containing Cu layer or the Cu alloy layer. Thereby, it is possible to provide a wiring layer structure which has a high adhesion property to the underlying substrate, excellent diffusion barrier property to prevent diffusion to the underlying substrate, excellent hydrogen plasma resistance (resistance to hydrogen plasma), and a low electrical resistance, and a manufacturing method thereof.

BEST MODE FOR CARRYING OUT THE INVENTION

Figure 1:
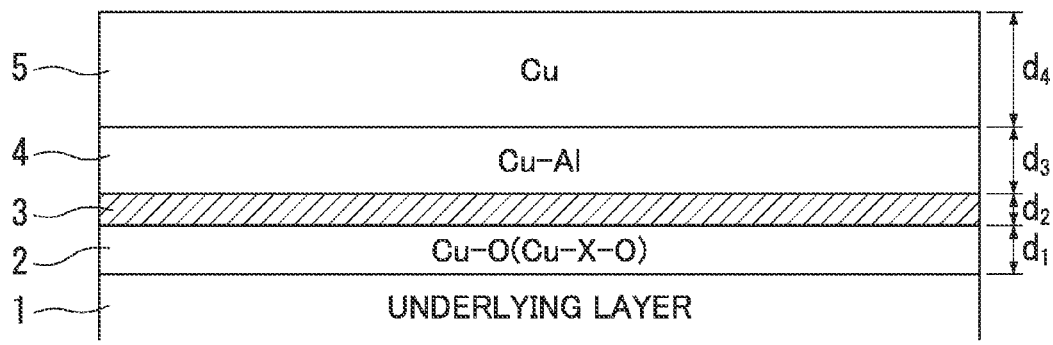
FIG. 1 is a schematic cross-sectional view illustrating a basic configuration of a wiring layer according to a first embodiment of the present invention.

Hereinafter, embodiments for carrying out the invention will be described in detail. Meanwhile, in the drawings used in the following description, the thickness of each layer is not shown at a reduced scale of the reality, in order to make the description easier to understand.

FIG. 1 is a schematic cross-sectional view illustrating a basic configuration of a wiring layer structure according to a first embodiment of the present invention. As shown in FIG. 1, a Cu—O layer 2 containing oxygen is formed on an underlying substrate 1 consisting of a semiconductor substrate or a glass substrate. The Cu—O layer 2 is provided in order to improve the adhesion property to the underlying substrate 1. An oxide layer 3 containing Al (which is in the form of $Al_2O_3$ in many cases) is formed on the Cu—O layer 2, a Cu alloy layer containing Al (Cu—Al alloy layer) 4 is formed on the oxide layer 3 containing Al, and a Cu conductive layer 5 is formed on the Cu—Al alloy layer 4. Here, examples of "the semiconductor substrate or the glass substrate" include a substrate which includes a semiconductor layer or a silica layer provided in one surface.

Next, a method for manufacturing the wiring layer structure having the basic configuration as shown in FIG. 1 will be described below.

At first, a semiconductor substrate or a glass substrate is prepared as the underlying substrate 1, and sputtering is performed on the surface thereof in an $O_2$ atmosphere using a target containing copper. The target containing copper used in this sputtering may contain at least one additive element selected from a group consisting of Ca, Mg, Li, Al, Zr, Ti, Si, Mn, Cr, and rare earth elements.

Figure 2A:
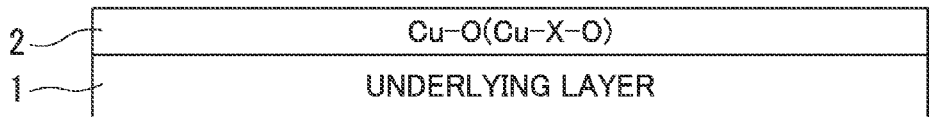
FIG. 2A is a schematic cross-sectional view for explaining a method for manufacturing the wiring layer shown in FIG. 1, and a diagram for explaining a step of forming a Cu—O layer on an underlying substrate.

This sputtering process is performed as follows. A vacuum chamber is evacuated by a vacuum pumping system, and then sputtering gas (inert gas such as Ar) and $O_2$ are introduced to prepare the $O_2$ atmosphere. The semiconductor or the glass substrate which is a film formation object is loaded into the vacuum chamber in a state of the $O_2$ atmosphere. A voltage is applied from a sputtering electrical power supply to the target containing copper while controlling the flow rate of oxygen gas. When the target containing copper is sputtered by plasma, minute particles composed of atoms or atomic groups of copper and the additive elements are emitted in the direction towards the underlying layer 1 and the atoms or the atomic groups react with oxygen. As a result, the Cu—O layer (barrier layer) 2 composed of copper (and the additive elements) and oxides thereof is formed on the surface of the underlying layer 1 as shown in FIG. 2A.

Figure 2B:
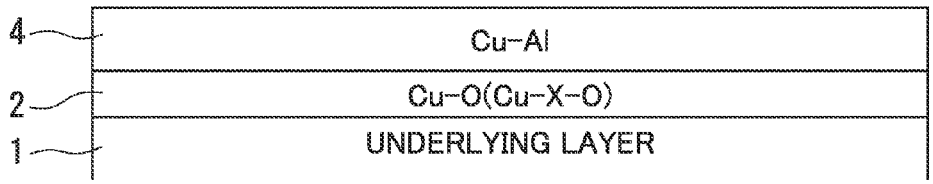
FIG. 2B is a schematic cross-sectional view for explaining the method for manufacturing the wiring layer shown in FIG. 1, and a diagram for explaining a step of forming a Cu—Al alloy layer on the surface of the Cu—O layer.

The sputtering of the target containing copper is continued to grow the Cu—O layer 2, and the introducing of the $O_2$ gas is stopped when the Cu—O layer 2 having a predetermined film thickness is formed. Then, the target is switched to a Cu—Al alloy, and the Cu—Al alloy target is sputtered while continuing the introducing of the sputtering gas (inert gas such as Ar). Thereby, the Cu—Al alloy layer 4 is formed on the surface of the Cu—O layer 2 (FIG. 2B).

Figure 2C:
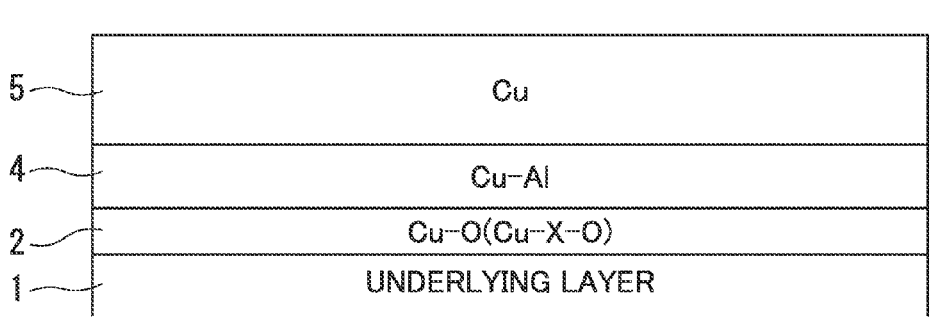
FIG. 2C is a schematic cross-sectional view for explaining the method for manufacturing the wiring layer shown in FIG. 1, and a diagram for explaining a step of forming a Cu conductive layer (low-resistivity layer) on the surface of the Cu—Al alloy layer.

Further, the sputtering of the Cu—Al alloy is continued to grow the Cu—Al alloy layer 4, and then, the target is switched to a pure copper (Cu) target when the Cu—Al layer 4 having a predetermined film thickness is formed. The pure copper (Cu) target is sputtered while continuing the introducing of the sputtering gas (inert gas such as Ar). Thereby, the Cu conductive layer (low-resistivity layer) 5 is foamed on the surface of the Cu—Al alloy layer 4. The sputtering of the pure copper target is continued to grow the Cu conductive layer 5, and the sputtering is stopped when the Cu conductive layer 5 having a predetermined film thickness is formed, and the resultant object is taken out from a sputtering apparatus (FIG. 2C).

The ratio (percentage) of copper and the additive element contained in the sputtering target is the same as the ratio (percentage) of copper and the additive element in a metal layer formed using the sputtering target in both of the case where the film formation is performed in a vacuum atmosphere to which only the sputtering gas is introduced, and the case where the film formation is performed in a vacuum atmosphere to which both of the oxygen gas and the sputtering gas are introduced. In addition, even in the case where the introduced amount of the oxygen gas is altered, the ratio (percentage) remains unchanged. Therefore, for example, in the case where the sputtering target of which the ratio of the additive element to the total amount of copper and the additive element is 15 atom % or less is sputtered, it is possible to obtain a metal layer of which the ratio of the additive element to the total amount of copper and the additive element is 15 atom % or less.

Figure 2D:
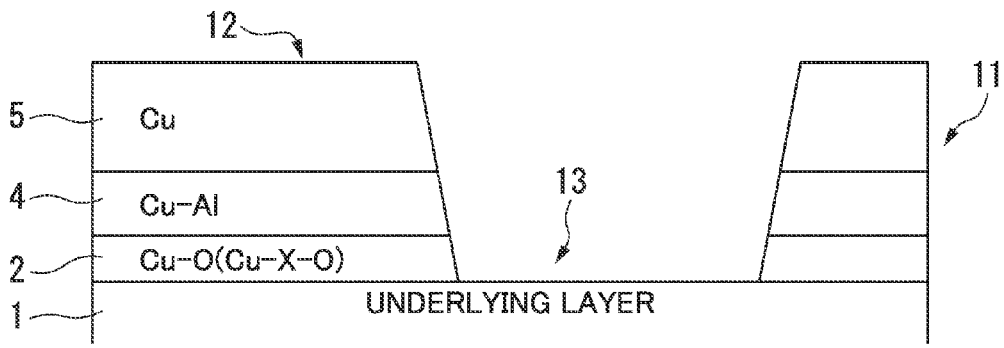
FIG. 2D is a schematic cross-sectional view for explaining the method for manufacturing the wiring layer shown in FIG. 1, and a diagram for explaining a step of patterning a laminated film.

Next, a resist film is disposed on the surface of a laminated film 11, a normal patterning such as exposure, development, and the like is performed to expose a portion of the surface of the laminated film 11. Then, the laminated film 11 in that state is exposed to an etchant (wet etching) or an etching gas (dry etching). Thereby, the laminated film 11 is patterned (FIG. 2D). Thereafter, the unnecessary resist film is removed by a normal method to form a wiring layer 12.

In the case where the wiring layer pattern is formed on a non-single crystal semiconductor thin film such as an amorphous silicon thin film, a poly crystal silicon thin film, or the like as mentioned above, a portion of the semiconductor is exposed. In this case, a large amount of dangling bonds exist in the surface 13 of the exposed semiconductor thin film. The dangling bond means a bonding partner which is not involved in a bond by losing a covalent bonding partner. These dangling bonds are unstable. Therefore, hydrogen plasma treatment is performed to terminate and stabilize the above-mentioned dangling bonds after the wiring layer pattern is formed in a process of manufacturing a semiconductor element including a non-single crystal semiconductor thin film.

Figure 2E:
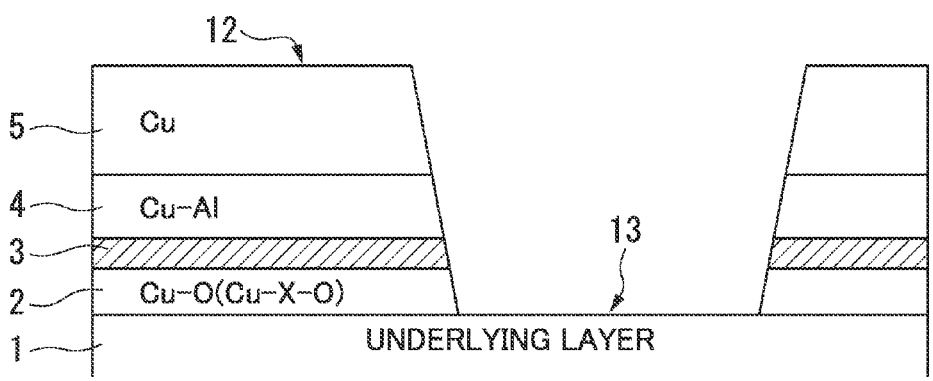
FIG. 2E is a schematic cross-sectional view for explaining the method for manufacturing the wiring layer shown in FIG. 1, and a diagram for explaining a step of performing hydrogen annealing to form an oxide layer in the interface between the Cu—Al alloy layer and the Cu—O layer.

In the present embodiment, hydrogen annealing is performed before the hydrogen plasma treatment. Thereby, oxygen atoms (O) in the Cu—O layer 2 are diffused to the Cu—Al alloy layer 4 containing Al, and an oxide layer 3 containing Al (which is in the form of $Al_2O_3$ in many cases) is formed in the interface between the Cu—Al alloy layer 4 and the Cu—O layer 2 (FIG. 2E). Even when the hydrogen plasma treatment is further performed, hydrogen ions hardly penetrate into the Cu—O layer 2 due to the existence of the oxide layer 3. Thereby, the reduction of oxygen in the Cu—O layer 2 hardly occurs; and as a result, the layer is hardly peeled off at the interface, and the adhesion property can be further improved. In the present embodiment, the thickness of the oxide layer 3 is secured to some extent by performing the hydrogen annealing before the hydrogen plasma treatment. Thereby, it is possible to further strengthen the hydrogen plasma resistance which causes the hydrogen ions to hardly penetrate into the Cu—O layer 2. The hydrogen annealing is a process desirable to obtain a sufficient thickness of the oxide layer 3.

In the present embodiment, the Cu—O layer 2 may further contain at least one additive element selected from a group consisting of Ca, Mg, Li, Al, Zr, Ti, Si, Mn, Cr, and rare earth metals. In FIG. 1, the additive element is denoted by "x" within parentheses. In addition, the content of the additive elements (one or more of Ca, Mg, Li, Al, Zr, Ti, Si, Mn, Cr, and rare earth metals) contained in the Cu—O layer 2 may be in a range of 20 atom % or less, and preferably in a range of 15 atom % or less. The reason why the additive elements such as Ca, Mg, Li, Al, Zr, Ti, Si, Mn, Cr, and rare earth metals are preferably included is as follows. These additive elements cause the oxide layer to be more easily formed in the interface between the Cu alloy layer and either of an oxygen-containing Cu layer or an oxygen-containing Cu alloy layer. In addition, these additive elements have an effect of enhancing the adhesion property between the oxygen-containing Cu alloy layer and the underlying substrate. In the case where the content of the additive elements is 20 atom % or less, the amount of oxides or intermetallic compounds generated in the Cu—O layer is limited; and thereby, the value of the electrical resistance does not remarkably increase, and problems do not occur when utilizing the wiring layer structure as the wiring layer. As described above, the ratio (percentage) of the additive elements can be adjusted depending on the ratio (percentage) of copper and the additive elements contained in the sputtering target.

In addition, the content of the oxygen contained in the Cu—O layer 2 is preferably in a range of 1 atom % to 30 atom %. In the case where the content of the oxygen is 1 atom % or more, sufficient adhesion property to material of the underlying substrate and sufficient diffusion barrier property are obtained. In the case where the content of the oxygen is 30 atom % or less, the amount of the oxides generated in the Cu—O layer is limited; and thereby, the value of electrical resistance does not remarkably increase, and problems do not occur when utilizing the wiring layer structure as the wiring layer. The ratio (percentage) of the oxygen contained in the Cu—O layer 2 can be adjusted depending on the $O_2$ atmosphere used in the sputtering, and the volume fraction of the $O_2$ atmosphere is preferably in a range of 1% to 30%.

In the present embodiment, although the Cu alloy layer 4 contains Al, components are not limited to Al, and the Cu alloy layer 4 may contain Zr or Ti alone, or one or more of Al, Zr, and Ti. The Cu alloy layer 4 may further contain at least one additive element selected from a group consisting of Ca, Mg, Li, Si, Mn, Cr, and rare earth metals. The content of the additive elements (one or more additive elements of Al, Zr, and Ti) contained in the above-mentioned Cu alloy layer 4 may be in a range of 1 atom % to 15 atom %, and preferably in a range of 4 atom % to 10 atom %. In the case where the content of the additive elements is 1 atom % or more, the oxide layer is sufficiently formed in the interface between the Cu alloy layer and the Cu—O layer; and thereby, the peeling resistance of the interface, that is, the adhesion property is sufficiently improved. In the case where the content of the above-mentioned additive elements is 15 atom % or less, the value of electrical resistance of the Cu alloy layer does not remarkably increase, and problems do not occur when utilizing the wiring layer structure as the wiring layer. As described above, the ratio (percentage) of the additive elements can be adjusted depending on the ratio (percentage) of copper and the additive elements contained in the sputtering target. The content of Ca, Mg, Li, Si, Mn, Cr, and rare earth metals is preferably in a range of 5 atom % or less. In the case where the content is 5 atom % or less, the resistance value (value of electrical resistance) does not remarkably increase.

The Cu conductive layer 5 preferably contains Cu at a content of 99 atom % or more. Thereby, it is possible to provide a low-resistive wiring layer. Such a Cu conductive layer 5 can be obtained by using a pure copper having a purity of 99 atom % or more as the pure copper target mentioned in the explanation of FIG. 2D.

The thickness $d_1$ of the Cu—O layer 2 is preferably in a range of 10 nm to 100 nm, and is more preferably in a range of approximately 30 nm to 50 nm. In addition, the thickness $d_2$ of the oxide layer 3 is preferably in a range of 1 nm to 20 nm, and is more preferably approximately 5 nm, in order to obtain the excellent hydrogen plasma resistance. In the case where the thickness of the oxide layer 3 is 1 nm or more, the oxide layer becomes uniform, and an effect of preventing the hydrogen ions from penetrating due to the oxide layer 3 is sufficiently obtained; and thereby, the excellent hydrogen plasma resistance can be obtained. In the case where the thickness of the oxide layer 3 is 20 nm or less, the value of electrical resistance does not remarkably increase, and problems do not occur when utilizing the wiring layer structure as the wiring layer. The thickness $d_3$ of the Cu—Al alloy layer 4 is preferably in a range of 10 nm to 100 nm, and is more preferably in a range of approximately 30 nm to 50 nm. The thickness $d_4$ of the Cu conductive layer 5 is preferably in a range of 200 nm to 10 μm, and is more preferably in a range of approximately 300 nm to 500 nm.

As described above, in accordance with the present embodiment, the oxide layer 3 containing Al is formed in the interface between the Cu—Al alloy layer 4 and the Cu—O layer 2. Thereby, it is possible to provide a wiring layer which has high adhesion property to the underlying substrate 1, excellent diffusion barrier property to prevent diffusion to the underlying substrate 1, excellent hydrogen plasma resistance, and a low electrical resistance, and a manufacturing method thereof.

Figure 3:
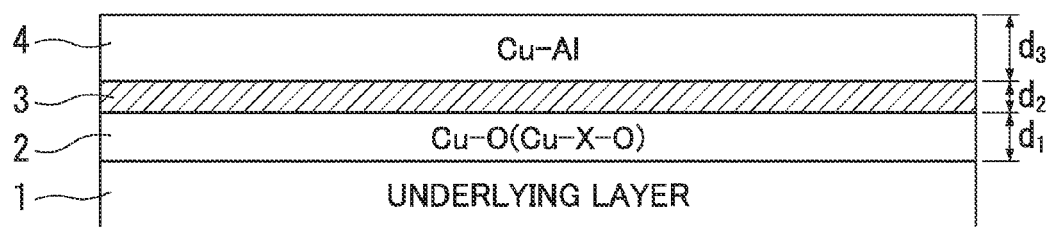
FIG. 3 is a schematic cross-sectional view illustrating a basic configuration of the wiring layer according to a second embodiment of the present invention.

Next, a second embodiment of the present invention will be described. FIG. 3 is a schematic cross-sectional view illustrating a basic configuration of the wiring layer according to the second embodiment of the present invention. The point in which the second embodiment of the present invention is structurally different from the first embodiment (structural difference between the first and second embodiments) is that the Cu conductive layer is not formed in the present embodiment, and other layers of the configuration are the same as those of the first embodiment. In FIG. 3, the same layers as shown in FIG. 1 are assigned the same reference numerals.

As shown in FIG. 3, a Cu—O layer 2 containing oxygen is formed on an underlying substrate 1 consisting of a semiconductor substrate or a glass substrate. The Cu—O layer 2 is provided in order to improve the adhesion property to the underlying substrate 1 similarly to the first embodiment. An oxide layer 3 containing Al (which is in the form of $Al_2O_3$ in many cases) is formed on the Cu—O layer 2, and the Cu alloy layer containing Al (Cu—Al alloy layer) 4 is formed on the oxide layer 3 containing Al.

In the second embodiment, a Cu conductive layer is not formed, and the Cu—Al alloy layer 4 functions similarly to the Cu conductive layer. That is, in the second embodiment, the Cu—Al alloy layer 4 is used as a conductive layer, according to the usage to be applied. In the second embodiment, thickening of the Cu—Al alloy layer 4 used as the conductive layer is an effective way to attain a low electrical resistance.

Similarly, in the second embodiment, hydrogen annealing is performed before the hydrogen plasma treatment. Thereby, the oxygen atoms (O) in the Cu—O layer 2 are diffused to the Cu—Al alloy layer 4, and an oxide layer 3 containing Al (which is in the form of $Al_2O_3$ in many cases) is formed in the interface between the Cu—Al alloy layer 4 and the Cu—O layer 2. When the hydrogen plasma treatment is performed, the hydrogen ions hardly penetrate into the Cu—O layer 2 due to the existence of the oxide layer 3. Thereby, the reduction of the oxygen in the Cu—O layer 2 hardly occurs; and as a result, the layer is hardly peeled off at the interface, and the adhesion property can be further improved. As is the case with the first embodiment, the hydrogen annealing is a process desirable to obtain a sufficient thickness of the oxide layer 3 in the second embodiment.

Similarly, in the second embodiment, the Cu—O layer 2 and the Cu alloy layer 4 may contain the same additive elements as those in the first embodiment at the same contents as those in the first embodiment. In addition, the content of oxygen contained in the Cu—O layer 2 is preferably in a range of 1 atom % to 30 atom %.

In addition, in the second embodiment, the thickness $d_1$ of the Cu—O layer 2, the thickness $d_2$ of the oxide layer 3, and the thickness $d_3$ of the Cu—Al alloy layer 4 are preferably set to the same thicknesses as those in the first embodiment.

In accordance with the second embodiment, it is possible to obtain the same effects as those of the first embodiment.

Next, while referring to FIGS. 4A to 7, a structure of a thin-film transistor (TFT) and a manufacturing process thereof will be described as an example of the semiconductor device in which the wiring layer according to the present invention is used.

Figure 4A:
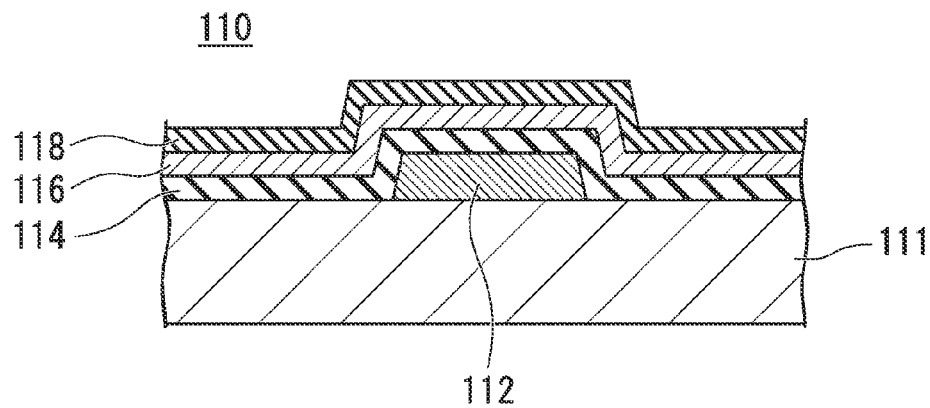
FIG. 4A is a schematic cross-sectional view illustrating a step of manufacturing a thin-film transistor (TFT) as an example of a semiconductor device in which the wiring layer according to the present invention is used, and a diagram illustrating a state in which a gate electrode, a gate insulating layer, a silicon layer, and an n-type silicon layer are formed on a transparent substrate.
Figure 4B:
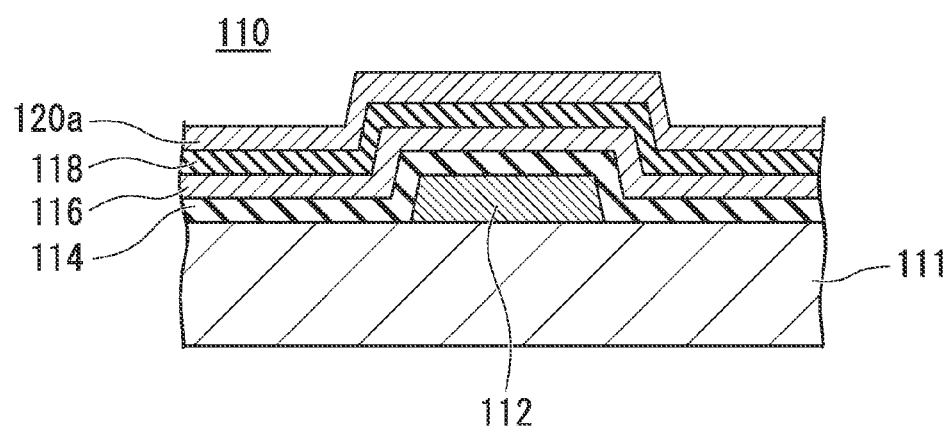
FIG. 4B is a schematic cross-sectional view illustrating the step of manufacturing the thin-film transistor (TFT) as an example of the semiconductor device in which the wiring layer according to the present invention is used, and a diagram illustrating a state in which a metal wiring layer according to the present invention is formed.

FIG. 4A is a cross-sectional view illustrating a processing object (object to be processed) 110 which will become a thin-film transistor according to the present invention. The processing object 110 which will become a thin-film transistor includes a transparent substrate 111 (underlying substrate) consisting of glass or the like, and a gate electrode 112 is disposed on the transparent substrate 111.

A gate insulating layer 114, a silicon layer 116, and an n-type silicon layer 118 which cover the gate electrode 112 are disposed on the transparent substrate 111 in this order from the transparent substrate 111 side. The n-type silicon layer 118 is a silicon layer of which the resistance value (the value of electrical resistance) is made lower than that of the silicon layer 116 by adding impurities. Here, the n-type silicon layer 118 and the silicon layer 116 are made of amorphous silicon; however, the n-type silicon layer 118 and the silicon layer 116 may be made of a single crystal or a poly crystal. The gate insulating layer 114 is an insulating film such as a silicon nitride thin film and the like, and the gate insulating layer 114 may be a silicon oxynitride film or one of other insulating films.

A copper alloy target is sputtered in an atmosphere in which oxidized gas is mixed; and thereby, an adhesion layer (oxygen-containing Cu alloy layer) which contains copper as a main component and further contains an additive element and oxygen is formed on the surface of the processing object 110 (step (a)).

Next, the copper alloy target is sputtered using sputtering gas such as Ar and the like; and thereby, the Cu alloy layer which contains copper as a main component and further contains the additive element is formed on the surface of the processing object 110 (step (b)). The numeral 120a in FIG. 4B denotes the metal wiring layer including the oxygen-containing Cu alloy layer and the Cu alloy layer according to the present invention as described above, and FIG. 7 shows an oxygen-containing Cu alloy layer 151 and a Cu alloy layer 152, respectively.

Figure 4C:
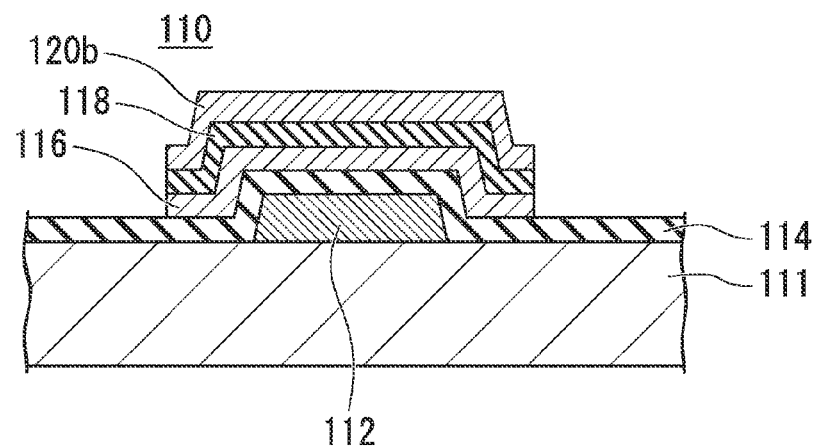
FIG. 4C is a schematic cross-sectional view illustrating the step of manufacturing the thin-film transistor (TFT) as an example of the semiconductor device in which the wiring layer according to the present invention is used, and a diagram illustrating a state in which a resist film is disposed on the surface of the metal wiring layer, and etching is performed.

A resist film is disposed on the surface of a portion of the metal wiring layer 120a which is located above the gate electrode 112, and a laminated film composed of the metal wiring layer 120a, the n-type silicon layer 118, and the silicon layer 116 is etched. Thereby, a portion of the laminated film which is not covered with the resist film is removed. FIG. 4C shows a state in which the resist film is removed after the laminated film is etched, and the numeral 120b denotes a portion of the metal wiring layer which is covered with the resist film during the etching and remains.

Figure 5A:
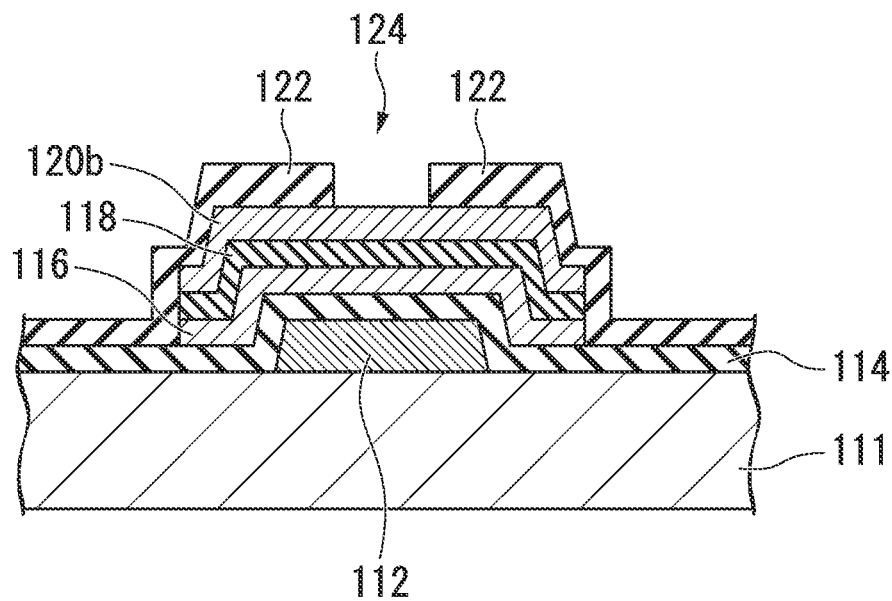
FIG. 5A is a schematic cross-sectional view illustrating the step of manufacturing the thin-film transistor (TFT) as an example of the semiconductor device in which the wiring layer according to the present invention is used, and a diagram illustrating a state in which a patterned resist film is disposed on the metal wiring layer.
Figure 5B:
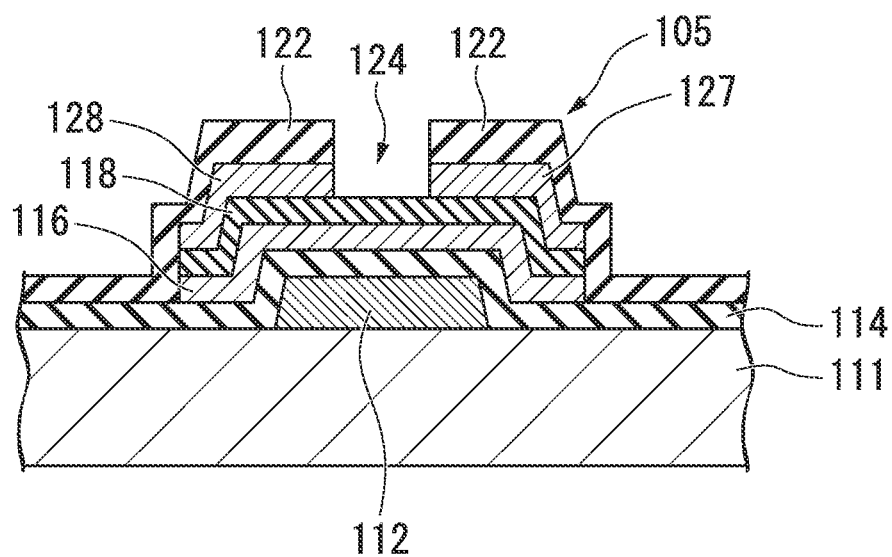
FIG. 5B is a schematic cross-sectional view illustrating the step of manufacturing the thin-film transistor (TFT) as an example of the semiconductor device in which the wiring layer according to the present invention is used, and a diagram illustrating a state in which the exposed portion of the metal wiring layer is etched and patterned.

Next, as shown in FIG. 5A, a patterned resist film 122 is disposed on the metal wiring layer 120b. Then, the laminated film is immersed in an etchant in the state where the surface of the metal wiring layer 120b is exposed to the bottom of an opening 124 of the resist film 122. Thereby, the exposed portion of the metal wiring layer 120*b* is etched, and the metal wiring layer 120*b* is patterned. The opening 124 through which the n-type silicon layer 118 is exposed is formed at a portion located above the gate electrode 112 by this patterning. The metal wiring layer 120*a* is separated by the opening 124; and thereby, a source electrode layer 127 and a drain electrode layer 128 are formed as shown in FIG. 5B. As a result, a transistor 105 according to the present invention is obtained. Next, the transistor is loaded into an etching apparatus, and a portion of the n-type silicon layer 118 which is exposed to the bottom of the opening 124 is exposed to plasma of etching gas. Thereby, the layer is etched, and the silicon layer 116 is exposed to the bottom of the opening 124. The opening 124 formed in the n-type silicon layer 118 is located above the gate electrode 112, and the n-type silicon layer 118 is separated into a source region 131 and a drain region 132 by the opening 124 (step (c)).

Figure 6A:
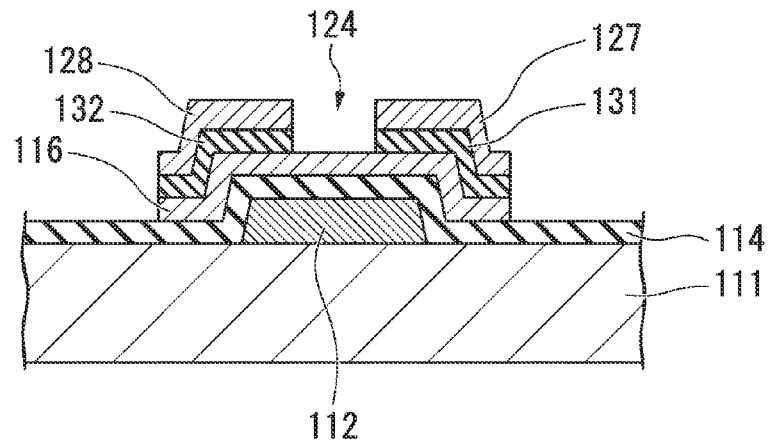
FIG. 6A is a schematic cross-sectional view illustrating the step of manufacturing the thin-film transistor (TFT) as an example of the semiconductor device in which the wiring layer according to the present invention is used, and a diagram illustrating a state in which an n-type silicon layer is etched, and a source region and a drain region are separated from each other by an opening 124.

When the surface of the silicon layer 116 is exposed to the bottom of the opening 124 and the silicon layer 116 is exposed to the etching gas plasma at the time of etching the n-type silicon layer 118, hydrogen atoms are removed from the surface of the silicon layer 116, and dangling bonds are formed. The dangling bonds lead to defective characteristics of a TFT such as a leakage current. In order to modify the dangling bonds again with hydrogen, the following process is performed. Hydrogen plasma is generated while introducing hydrogen gas in a state where the source electrode layer 127 and the drain electrode layer 128 are exposed as shown in FIG. 6A. Thereby, the portion of the silicon layer 116 exposed to the bottom of the opening 124 is exposed to the hydrogen gas plasma. As a result, silicon atoms in the surface of the silicon layer 116 are bonded to the hydrogen, and the dangling bonds vanish (step (d)).

Hydrogen annealing is performed after the above-mentioned step (b) and before the above-mentioned step (d), and an oxide layer is formed in the interface between the Cu alloy layer and either of the oxygen-containing Cu layer or the oxygen-containing Cu alloy layer (step (e)).

Figure 6B:
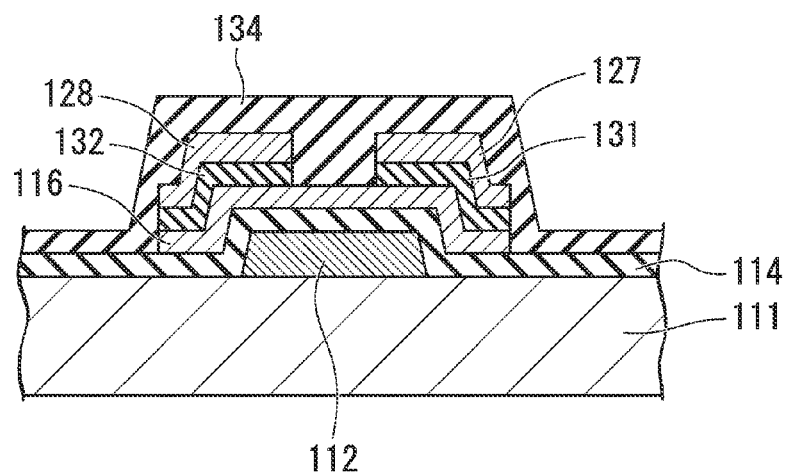
FIG. 6B is a schematic cross-sectional view illustrating the step of manufacturing the thin-film transistor (TFT) as an example of the semiconductor device in which the wiring layer according to the present invention is used, and a diagram illustrating a state in which a passivation layer is formed after hydrogen plasma treatment is performed.
Figure 6C:
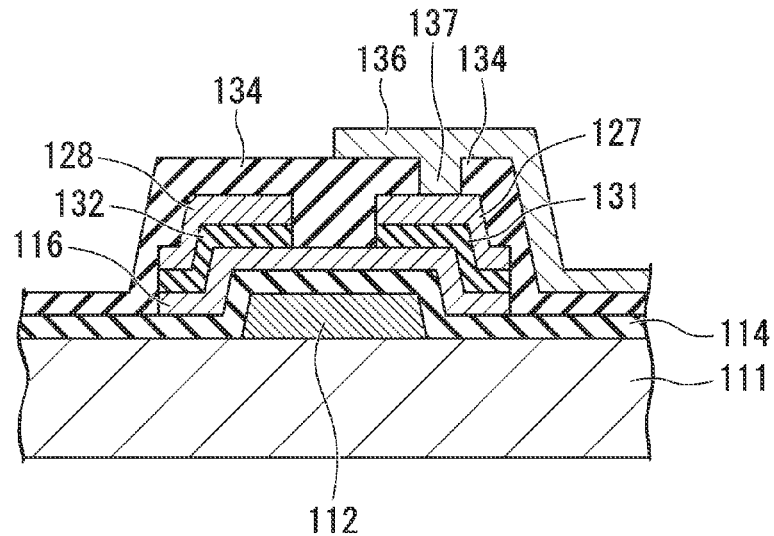
FIG. 6C is a schematic cross-sectional view illustrating the step of manufacturing the thin-film transistor (TFT) as an example of the semiconductor device in which the wiring layer according to the present invention is used, and a diagram illustrating a state in which a transparent electrode layer is formed.
Figure 7:
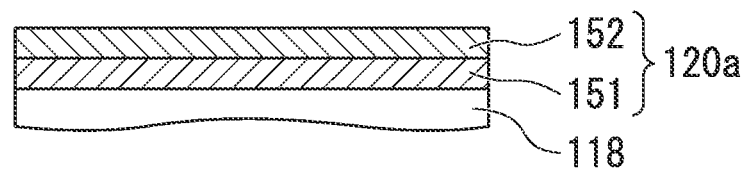
FIG. 7 is a diagram illustrating an oxygen-containing Cu alloy layer and a Cu alloy layer in the metal wiring layer of FIG. 4B.

After the hydrogen plasma treatment is performed, as shown in FIG. 6B, a passivation layer 134 such as a silicon nitride layer ($SiN_x$) and the like is formed. A contact hole 137 is formed in the passivation layer 134, and then, as shown in FIG. 6C, a transparent electrode layer 136 is formed which connects either of the source electrode layer 127 or the drain electrode layer 128 with a pixel electrode (not shown) or the like. Thereby, a liquid crystal display panel is obtained.

The wiring layer structure formed by the present invention can be applied to not only a source electrode and a drain electrode of the TFT, but also a gate electrode of the TFT.

Further, the thin-film transistor (TFT) is explained above as a example of the semiconductor device; however, the present invention is not limited thereto, and the present invention can be applied to various electrodes of a semiconductor device, a diode, a capacitor, a liquid crystal device and the like other than the thin-film transistor (TFT).

EXAMPLES

Wiring layer structures were formed in reality on the basis of the present invention, and the wiring layer structures were evaluated. Hereinafter, the evaluation results will be described.

At first, a glass substrate having dimensions of 320 mm long, 400 mm wide, and 0.7 mm thick was prepared of which the surface was coated with an amorphous Si layer.

(Preparation of Oxygen-Containing Cu Alloy Layer)

Next, a Cu alloy sputtering target was prepared by melting and adjusting the composition to include Cu-4atom % Al (melting adjustment). The glass substrate was loaded in a sputtering apparatus, and sputtering was performed using the Cu alloy sputtering targets under the following conditions to form an oxygen-containing Cu alloy layer having a thickness of 50 nm:

Atmosphere: oxidizing atmosphere of Ar+oxygen (Ar/oxygen=90/10 by vol %);

Pressure of the atmosphere: 0.4 Pa; and

Substrate heating temperature: 100° C.

(Preparation of Cu Alloy Layer)

A Cu alloy sputtering target was prepared by melting and adjusting the compositions to include Cu-4atom % Al (melting adjustment). Sputtering was performed using the Cu alloy sputtering target under the following conditions to form a Cu alloy layer having a thickness of 300 nm:

Atmosphere: Ar;

Pressure of the atmosphere: 0.4 Pa; and

Substrate heating temperature: 100° C.

(Hydrogen Annealing)

Next, hydrogen anneal was performed under the following conditions:

Atmosphere: $H_2+N_2$ ($H_2/N_2$=50/50 by vol %);

Pressure of the atmosphere: 0.1 MPa (1 atmospheric pressure);

Temperature: 300° C.; and

Retention time (Holding time): 30 minutes.

(Evaluation of Thin-Film Structure)

Figure 8A:
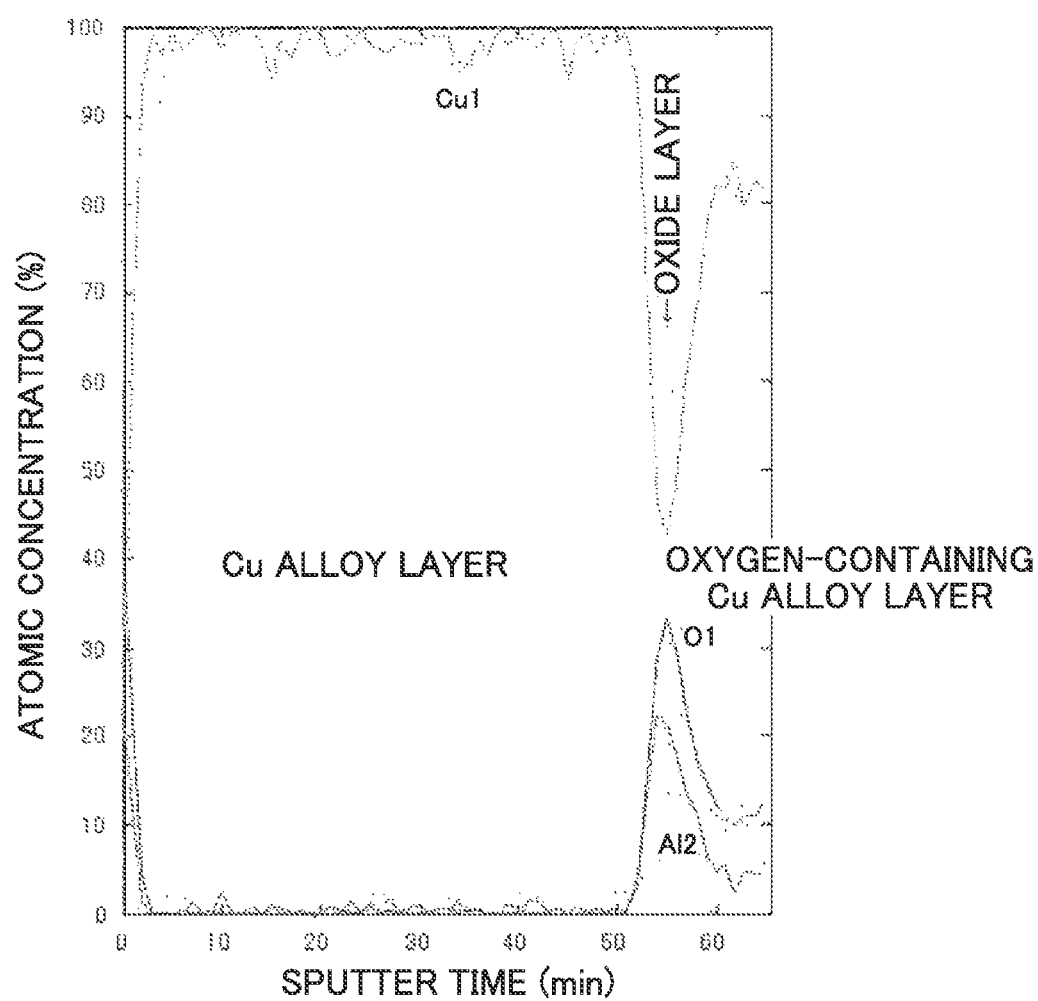
FIG. 8A is a diagram illustrating a result of a depth profile analysis of a sample using an Auger electron spectroscopy analysis.
Figure 8B:
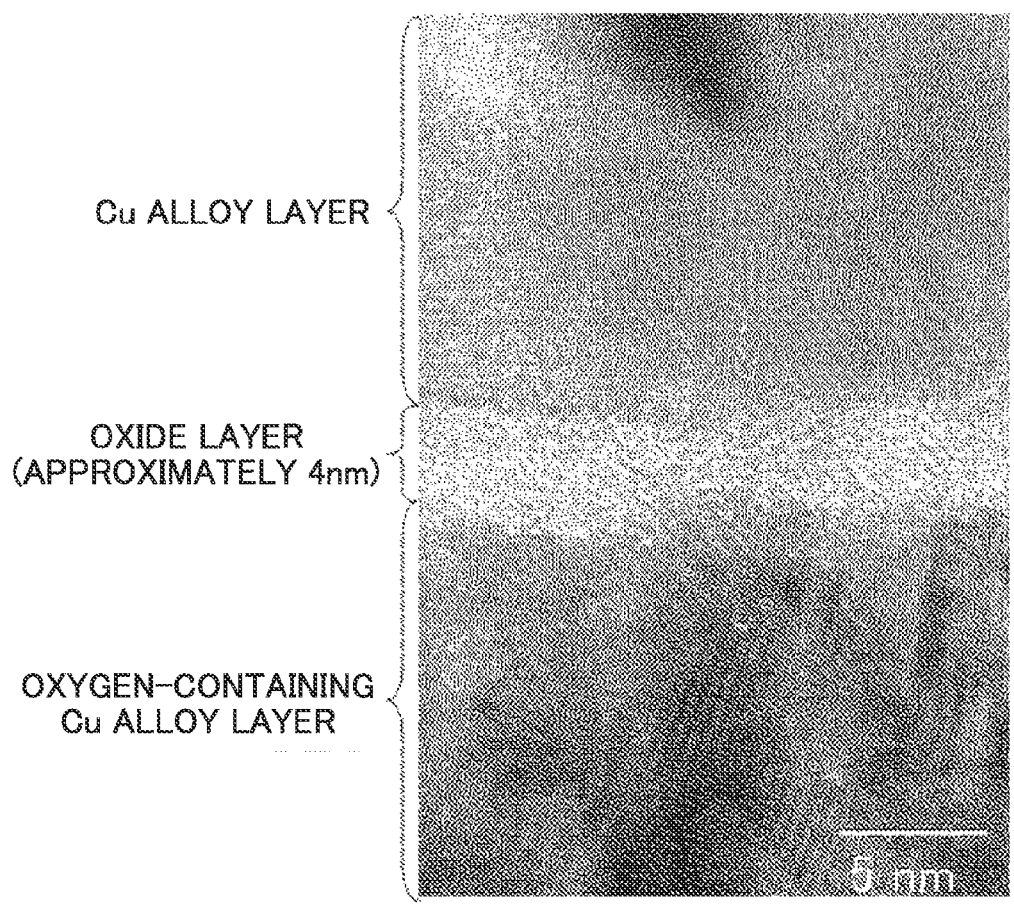
FIG. 8B is a diagram illustrating a result obtained by observing a cross-section of the sample using a TEM (transmission electron microscope).

The depth profile of a sample was analyzed through an Auger electron spectroscopy analysis, and the cross-section of the sample was observed through a TEM (transmission electron microscope). The result is shown in FIGS. 8A and 8B. FIG. 8A shows a result of the depth profile analysis of the wiring layer structure through the Auger electron spectroscopy analysis, and FIG. 8B shows a transmission electron microscope image of the cross-section of the sample (film). As shown in FIG. 8A, it was identified through the depth profile analysis that Al and O was concentrated in the boundary between the Cu alloy layer and the oxygen-containing Cu alloy layer (at a portion formed during the sputtering time of about 50 minutes to about 60 minutes). In addition, as shown in FIG. 8B, it was identified from the TEM image (magnification: 500,000 or more) of the cross-section, that a concentration layer of Al and O situated between the Cu alloy layer and the oxygen-containing Cu alloy layer had a crystal structure obviously different from those of the Cu alloy layer and the oxygen-containing Cu alloy layer, and the concentration layer of Al and O had a thickness of about 4 nm. From these results, it was identified that the layer generated between the Cu alloy layer and the oxygen-containing Cu alloy layer had a different phase and included oxygen and an additive element (in this case, Al) as main components; and therefore, it was determined that this layer was an oxide layer. "An oxide layer" described in claim 1 indicates this layer having a different phase which was specified by the Auger electron spectroscopy analysis and the TEM (transmission electron microscope). In addition, the specific resistance of the Cu alloy layer according to the present invention was measured by a four-probe test, and the measured specific resistance thereof was appropriately 5 μΩcm.

(Hydrogen Plasma Treatment)

Hydrogen plasma treatment was performed under the following conditions:
Atmosphere: hydrogen gas;
Hydrogen gas flow rate: 500 sccm;
Hydrogen gas pressure: 250 Pa;
Treatment temperature: 250° C.;
Output: 0.1 W/cm$^2$; and
Treatment time: 60 seconds.

(Cross-Cut Adhesion Test)

Before and after the above-mentioned hydrogen plasma treatment, the following cross-cut adhesion test was performed.

In accordance with JIS-5400, 11-by-11 grooves (notches) were formed in the surface of the sample by using a cutter, at an interval selected from 0.5 mm, 1 mm, 1.5 mm, and 2 mm, at a depth reaching the glass substrate from the surface and at a groove width of 0.1 mm. Thereby, 100 cells (squares) were formed at each of the intervals. A Scotch tape manufactured by 3M was adhered throughout the squares, and then was taken away from the surface at once. The number (number/100) of squares peeled off among the hundred squares in the surface of the sample was measured. As a result, the number of squares peeled off was zero.

Table 1 is shows Examples (left) according to the present invention to compare with each other. Table 1 shows the compositions (additive elements) and the thicknesses of the oxygen-containing Cu alloy layer and the Cu alloy layer, the thickness of the pure copper layer, and the results of the cross-cut adhesion tests before and after the hydrogen plasma treatment, with respect to each of Examples 1 to 17 and Comparative Examples 1 and 2. Here, the structure of the glass substrate is the same as described above. That is, a glass substrate having dimensions of 320 mm long, 400 mm wide, and 0.7 mm thick was used of which the surface was coated with an amorphous Si layer. The sputtering conditions for preparing the oxygen-containing Cu alloy layer were the same as described above, that is:
Atmosphere: oxidizing atmosphere of Ar+oxygen (Ar/oxygen=90/10 by vol %);
Pressure of the atmosphere: 0.4 Pa; and
Substrate heating temperature: 100° C.

The sputtering conditions for preparing the Cu alloy layer are also the same as described above, that is:
Atmosphere: Ar;
Pressure of the atmosphere: 0.4 Pa; and
Substrate heating temperature: 100° C.

However, the composition and the film thickness of each layer were changed. In addition, the sputtering conditions for preparing the pure copper layer of the next step were the same as the sputtering conditions of the Cu alloy layer, that is:
Atmosphere: Ar;
Pressure of the atmosphere: 0.4 Pa; and
Substrate heating temperature: 100° C.

However, a pure copper sputtering target (a content of inevitable impurities was less than 1 atom %) was used, and the film thickness was changed. Further, conditions of the hydrogen annealing, the method of evaluating the thin-film structure, conditions of the hydrogen plasma treatment, and conditions of the cross-cut adhesion test conditions were the same as described above.

TABLE 1

|  |  |  | Example | | | | | | | | | | |
|---|---|---|---|---|---|---|---|---|---|---|---|---|---|
|  |  |  | 1 | 2 | 3 | 4 | 5 | 6 | 7 | 8 | 9 | 10 | 11 |
| Oxygen-Containing Cu alloy Layer | Target Composition (atom %) | Al | 8 | 7 | 9 | 10 | 4 |  |  |  | 10 |  | 5 |
|  |  | Zr |  |  |  |  |  |  |  |  |  |  |  |
|  |  | Ti |  |  |  |  |  |  |  |  |  |  |  |
|  |  | Ca |  | 1 |  | 0.5 |  |  |  | 2 | 2 |  |  |
|  |  | Mg | 2 |  |  |  | 2 | 3 |  |  | 3 |  |  |
|  |  | Li |  |  |  |  |  |  | 1 |  |  |  |  |
|  |  | Si |  |  |  |  |  |  |  |  |  |  | 1 |
|  |  | Mn |  |  |  |  |  | 1 |  |  |  | 1 |  |
|  |  | Cr |  |  |  |  |  |  | 3 | 1 |  | 2 | 1 |
|  |  | La |  |  |  |  |  |  |  |  |  |  |  |
|  |  | Ce |  |  |  |  |  |  |  |  |  |  |  |
|  | Total |  | 10 | 8 | 9 | 10.5 | 6 | 4 | 4 | 3 | 15 | 3 | 7 |
|  | Thickness (nm) |  | 50 | 50 | 50 | 50 | 50 | 50 | 50 | 50 | 50 | 50 | 50 |
| Cu Alloy Layer | Target Composition (atom %) | Al | 8 | 7 | 9 | 10 | 4 | 8 | 8 | 5 |  | 13 | 8 |
|  |  | Zr |  |  |  |  |  | 1 | 1 | 2 | 2 | 1 |  |
|  |  | Ti |  |  |  |  |  |  |  | 1 | 4 | 10 |  |
|  |  | Ca |  | 1 |  | 0.5 |  |  |  |  |  |  |  |
|  |  | Mg | 2 |  |  |  | 2 | 2 |  |  | 2 |  |  |
|  |  | Li |  |  |  |  |  |  |  |  |  |  |  |
|  |  | Si |  |  |  |  |  |  |  |  |  |  | 1 |
|  |  | Mn |  |  |  |  |  |  |  |  |  | 1 |  |
|  |  | Cr |  |  |  |  |  |  |  |  |  |  |  |
|  |  | La |  |  |  |  |  |  |  |  |  |  | 1 |
|  |  | Ce |  |  |  |  |  |  |  |  |  |  |  |
|  | Total (Al + Zr + Ti) |  | 8 | 7 | 9 | 10 | 4 | 10 | 9 | 11 | 12 | 14 | 8 |
|  | Total (Others) |  | 2 | 1 | 0 | 0.5 | 2 | 2 | 0 | 0 | 2 | 1 | 2 |
|  | Thickness (nm) |  | 50 | 50 | 50 | 50 | 50 | 50 | 50 | 50 | 50 | 50 | 50 |
| Pure Copper layer Thickness (nm) |  |  | 300 | 300 | 300 | 300 | 300 | 300 | 300 | 300 | 300 | 300 | 300 |
| Hydrogen Annealing |  |  | Yes | Yes | Yes | Yes | Yes | Yes | Yes | Yes | Yes | Yes | Yes |

TABLE 1-continued

|  |  |  |  |  |  |  |  |  |  |  |  |  |  |
|---|---|---|---|---|---|---|---|---|---|---|---|---|---|
| Oxide Layer Thickness (nm) |  |  |  | 5 | 4 | 7 | 6 | 3 | 6 | 5 | 7 | 4 | 7 | 5 |
| Cross-Cut Adhesion Test | Before Hydrogen Plasma Treatment | 0.5 mm Interval | 0 | 0 | 0 | 0 | 0 | 0 | 0 | 0 | 0 | 0 | 0 |
|  |  | 1 mm Interval | 0 | 0 | 0 | 0 | 0 | 0 | 0 | 0 | 0 | 0 | 0 |
|  |  | 1.5 mm Interval | 0 | 0 | 0 | 0 | 0 | 0 | 0 | 0 | 0 | 0 | 0 |
|  |  | 2 mm Interval | 0 | 0 | 0 | 0 | 0 | 0 | 0 | 0 | 0 | 0 | 0 |
|  | After Hydrogen Plasma Treatment | 0.5 mm Interval | 0 | 0 | 0 | 0 | 0 | 0 | 1 | 0 | 0 | 1 | 0 |
|  |  | 1 mm Interval | 0 | 0 | 0 | 0 | 0 | 0 | 0 | 0 | 0 | 0 | 0 |
|  |  | 1.5 mm Interval | 0 | 0 | 0 | 0 | 0 | 0 | 0 | 0 | 0 | 0 | 0 |
|  |  | 2 mm Interval | 0 | 0 | 0 | 0 | 0 | 0 | 0 | 0 | 0 | 0 | 0 |

|  |  |  |  | Example |  |  |  |  |  | Comparative Example |  |
|---|---|---|---|---|---|---|---|---|---|---|---|
|  |  |  |  | 12 | 13 | 14 | 15 | 16 | 17 | 1 | 2 |
| Oxygen-Containing Cu alloy Layer | Target Composition (atom %) | Al |  | 5 | 15 |  |  | 8 | 8 | 4 |  |
|  |  | Zr |  | 1 |  | 8 |  |  |  |  |  |
|  |  | Ti |  | 3 | 1 |  |  |  |  |  |  |
|  |  | Ca |  |  |  |  |  |  |  |  |  |
|  |  | Mg |  |  | 1 |  |  | 2 | 2 | 2 |  |
|  |  | Li |  |  |  |  |  |  |  |  |  |
|  |  | Si |  |  |  |  |  |  |  |  |  |
|  |  | Mn |  |  |  |  |  |  |  |  |  |
|  |  | Cr |  |  |  |  |  |  |  |  |  |
|  |  | La |  |  | 1 |  |  |  |  |  |  |
|  |  | Ce |  |  | 1 | 5 |  |  |  |  |  |
|  |  | Total |  | 9 | 19 | 13 | 0 | 10 | 10 | 6 | 0 |
|  |  | Thickness (nm) |  | 50 | 50 | 50 | 50 | 25 | 50 | 50 | 50 |
| Cu Alloy Layer | Target Composition (atom %) | Al |  | 8 | 1.5 | 8 | 14 | 8 | 8 | 4 |  |
|  |  | Zr |  |  |  |  |  |  |  |  |  |
|  |  | Ti |  |  |  |  |  |  |  |  |  |
|  |  | Ca |  |  |  |  |  |  |  |  |  |
|  |  | Mg |  |  |  | 2 |  | 2 | 2 | 2 |  |
|  |  | Li |  | 1 |  |  |  |  |  |  |  |
|  |  | Si |  |  |  |  |  |  |  |  |  |
|  |  | Mn |  |  |  |  |  |  |  |  |  |
|  |  | Cr |  | 1 |  |  |  |  |  |  |  |
|  |  | La |  |  |  |  |  |  |  |  |  |
|  |  | Ce |  |  | 1 |  |  |  |  |  |  |
|  |  | Total (Al + Zr + Ti) |  | 8 | 1.5 | 8 | 14 | 8 | 8 | 4 |  |
|  |  | Total (Others) |  | 2 | 1 | 2 | 0 | 2 | 2 | 2 | 0 |
|  |  | Thickness (nm) |  | 50 | 50 | 50 | 50 | 25 | 400 | 50 | 50 |
| Pure Copper layer Thickness (nm) |  |  |  | 300 | 300 | 300 | 300 | 200 | No | 300 | 300 |
| Hydrogen Annealing |  |  |  | Yes | Yes | Yes | Yes | Yes | Yes | No | Yes |
| Oxide Layer Thickness (nm) |  |  |  | 5 | 3 | 5 | 7 | 5 | 7 | No | No |
| Cross-Cut Adhesion Test | Before Hydrogen Plasma Treatment | 0.5 mm Interval |  | 0 | 0 | 0 | 0 | 0 | 0 | 0 | 100 |
|  |  | 1 mm Interval |  | 0 | 0 | 0 | 0 | 0 | 0 | 0 | 83 |
|  |  | 1.5 mm Interval |  | 0 | 0 | 0 | 0 | 0 | 0 | 0 | 40 |
|  |  | 2 mm Interval |  | 0 | 0 | 0 | 0 | 0 | 0 | 0 | 0 |
|  | After Hydrogen Plasma Treatment | 0.5 mm Interval |  | 0 | 0 | 0 | 2 | 0 | 0 | 9 | 100 |
|  |  | 1 mm Interval |  | 0 | 0 | 0 | 0 | 0 | 0 | 2 | 100 |
|  |  | 1.5 mm Interval |  | 0 | 0 | 0 | 0 | 0 | 0 | 0 | 100 |
|  |  | 2 mm Interval |  | 0 | 0 | 0 | 0 | 0 | 0 | 0 | 51 |

The hydrogen annealing was not performed in Comparative Example 1, and the Cu alloy layer did not substantially contain alloy elements in Comparative Example 2 (hydrogen annealing was performed). From the results of the cross-cut adhesion test, it was identified that with regard to with regard to Comparative Examples 1 and 2, the results of the cross-cut adhesion test after the hydrogen plasma treatment were bad; and therefore, the hydrogen plasma treatment resistances (resistances to hydrogen plasma treatment) thereof were poor. In particular, with regard to Comparative Example 2, since the additive elements were not contained in the oxygen-containing Cu alloy layer, the adhesion property between the oxygen-containing Cu alloy layer and the underlying substrate became low; and thereby, the results of the cross-cut adhesion test before the hydrogen plasma treatment were bad. It was identified that with regard to the wiring layer structures (Examples 1 to 17) according to the present invention, the results of the cross-cut adhesion test after the hydrogen plasma treatment were good; and therefore, the adhesion properties were high, and the hydrogen plasma treatment resistances (resistances to hydrogen plasma treatment) thereof were excellent.

Industrial Applicability

In accordance with the wiring layer structure of the of the present invention and the manufacturing method thereof, it is possible to provide a wiring layer structure which has a high adhesion property to the underlying substrate, excellent diffusion barrier property to prevent diffusion to the underlying substrate, excellent hydrogen plasma resistance (resistance to hydrogen plasma), and a low electrical resistance, and a manufacturing method thereof.

Brief Description Of Reference Signs

| | |
|---|---|
| 1: | underlying substrate |
| 2: | Cu—O layer (oxygen-containing Cu layer or oxygen-containing Cu alloy layer) |
| 3: | oxide layer containing Al |
| 4: | Cu—Al alloy layer |
| 5: | Cu conductive layer |
| 11: | laminated film |
| 12: | wiring layer |
| 13: | surface of semiconductor thin-film |
| 105: | transistor |
| 111: | transparent substrate |
| 112: | gate electrode |
| 114: | gate insulating layer |
| 116: | silicon layer |
| 118: | n-type silicon layer |
| 120a: | metal wiring layer |
| 120b: | metal wiring layer |
| 122: | resist film |
| 127: | source electrode layer |
| 128: | drain electrode layer |
| 131: | source region |
| 132: | drain region |
| 134: | passivation layer |
| 136: | transparent electrode layer |
| 137: | contact hole |
| 151: | oxygen-containing Cu alloy layer |
| 152: | Cu alloy layer |

The invention claimed is:

1. An electrode layer structure for a thin-film transistor comprising:
   an underlying substrate of a semiconductor substrate or a glass substrate;
   an oxygen-containing Cu layer or an oxygen-containing Cu alloy layer which is formed on the underlying substrate;
   an oxide layer containing at least one of Al, Zr, and Ti; and
   a Cu alloy layer containing at least one of Al, Zr, and Ti,
   wherein the oxide layer containing at least one of Al, Zr, and Ti is formed in an interface between the Cu alloy layer containing at least one of Al, Zr, and Ti and either of the oxygen-containing Cu layer or the oxygen-containing Cu alloy layer.

2. The electrode layer structure for a thin-film transistor according to claim 1, wherein a content of oxygen contained in the oxygen-containing Cu layer or the oxygen-containing Cu alloy layer is in a range of 1 atom % to 30 atom %.

3. The electrode layer structure for a thin-film transistor according to claim 1, wherein the Cu alloy layer further contains at least one additive element selected from a group consisting of Ca, Mg, Li, Si, Mn, Cr, and rare earth metals.

4. The electrode layer structure for a thin-film transistor according to claim 1, wherein a total content of Al, Zr, and Ti contained in the Cu alloy layer is in a range of 1 atom % to 15 atom %.

5. A thin-film transistor comprising:
   an underlying substrate of a semiconductor substrate or a glass substrate;
   a gate electrode formed on the underlying substrate;
   a gate insulating layer that covers the gate electrode;
   a semiconductor layer formed on the gate insulating layer;
   a source region and a drain region formed on the semiconductor layer; and
   a source electrode layer and a drain electrode layer formed in contact with the source region and the drain region, respectively,
   wherein at least one of the gate electrode, the source electrode layer, and the claim electrode layer is formed from the electrode layer structure for a thin-film transistor according to claim 1.

6. The electrode layer structure for a thin-film transistor according to claim 1, wherein the oxygen-containing Cu alloy layer contains at least one additive element selected from a group consisting of Ca, Mg, Li, Al, Zr, Ti, Si, Mn, Cr, and rare earth metals.

7. The electrode layer structure for a thin-film transistor according to claim 6, wherein a content of the additive elements contained in the oxygen-containing Cu alloy layer is in a range of 20 atom % or less.

8. The electrode layer structure for a thin-film transistor according to claim 6, wherein a content of oxygen contained in the oxygen-containing Cu layer or the oxygen-containing Cu alloy layer is in a range of 1 atom % to 30 atom %.

9. The electrode layer structure for a thin-film transistor according to claim 1, wherein the electrode layer structure further comprises a Cu conductive layer which is formed on the Cu alloy layer.

10. The electrode layer structure for a thin-film transistor according to claim 9, wherein the Cu conductive layer consists of pure copper having a purity of 99 atom % or more.

11. The electrode layer structure for a thin-film transistor according to claim 9, wherein the oxygen-containing Cu layer or the oxygen-containing Cu alloy layer has a thickness of 10 nm to 100 nm, the oxide layer has a thickness of 1 nm to 20 nm, the Cu alloy layer has a thickness of 10 nm to 100 nm, and the Cu conductive layer has a thickness of 200 nm to 10 μm.

12. A method for manufacturing an electrode layer structure for a thin-film transistor, comprising: in series,
   a step (a) of performing sputtering in a $O_2$ atmosphere using a target containing at least Cu on an underlying substrate of a semiconductor substrate or a glass substrate;

a step (b) of performing sputtering in an inert gas atmosphere using a Cu alloy containing at least one of Al, Zr, and Ti as a target;

a step (c) of forming a wiring layer pattern in layers formed by the step (a) and the step (b) through etching, and exposing a portion of the underlying substrate; and a step (d) of performing a hydrogen plasma treatment to terminate dangling bonds which exist in an exposed surface of the underlying substrate, wherein the method further comprises a step (e) of performing annealing in a hydrogen atmosphere after the step (b) and before the step (d).

13. The method for manufacturing an electrode layer structure for a thin-film transistor according to claim 12, wherein a volume fraction of the $O_2$ atmosphere used in the sputtering of the step (a) is in a range of 1% to 30%.

14. The method for manufacturing an electrode layer structure for a thin-film transistor according to claim 12, wherein the Cu alloy target containing at least one of Al, Zr, and Ti further contains at least one additive element selected from a group consisting of Ca, Mg, Li, Si, Mn, Cr, and rare earth metals.

15. The method for manufacturing an electrode layer structure for a thin-film transistor according to claim 12, wherein a content of the additive elements of Al, Zr, and Ti contained in the Cu alloy target containing at least one of Al, Zr, and Ti is in a range of 1 atom % to 15 atom %.

16. The method for manufacturing an electrode layer structure for a thin-film transistor according to claim 12, wherein the method further comprises a step (f) of performing sputtering in an inert gas atmosphere using a target containing at least Cu after the step (b).

17. The method for manufacturing an electrode layer structure for a thin-film transistor according to claim 16, wherein the target containing at least Cu used in the step (f) contains Cu at a content in a range of 99 atom % or more.

18. The method for manufacturing an electrode layer structure for a thin-film transistor according to claim 12, wherein the target containing at least Cu used in the step (a) further contains at least one additive element selected from a group consisting of Ca, Mg, Li, Al, Zr, Ti, Si, Mn, Cr, and rare earth metals.

19. The method for manufacturing an electrode layer structure for a thin-film transistor according to claim 18, wherein a content of the additive elements contained in the target containing at least Cu used in the step (a) is in a range of 20 atom % or less.

20. A method for manufacturing a thin-film transistor, comprising a step of forming a gate electrode on an underlying substrate of a semiconductor substrate or a glass substrate;

a step of forming a gate insulating layer that covers the gate electrode;

a step of forming a semiconductor layer on the gate insulating layer;

a step of forming a semiconductor layer in which an impurity is added at a high concentration on the semiconductor layer;

a step of forming a metal wiring layer on the semiconductor layer in which the impurity is added at a high concentration; and a step of patterning the metal wiring layer, the semiconductor layer in which the impurity is added at a high concentration, and the semiconductor layer, wherein the metal wiring layer is manufactured by the method for manufacturing an electrode layer structure for a thin-film transistor according to claim 12, the step of forming the metal wiring layer corresponds to the steps (a) and (b), and the step of patterning corresponds to the step (c).

* * * * *